(12) United States Patent
Moon et al.

(10) Patent No.: US 11,943,966 B2
(45) Date of Patent: *Mar. 26, 2024

(54) DISPLAY DEVICE

(71) Applicant: SAMSUNG DISPLAY CO., LTD., Yongin-si (KR)

(72) Inventors: Sungjae Moon, Yongin-si (KR); Dongwoo Kim, Yongin-si (KR); Junhyun Park, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/653,895

(22) Filed: Mar. 8, 2022

(65) Prior Publication Data

US 2022/0199960 A1 Jun. 23, 2022

Related U.S. Application Data

(62) Division of application No. 16/793,394, filed on Feb. 18, 2020, now Pat. No. 11,283,054.

(30) Foreign Application Priority Data

Mar. 13, 2019 (KR) .................. 10-2019-0028856

(51) Int. Cl.
*H10K 50/86* (2023.01)
*H10K 50/842* (2023.01)
(Continued)

(52) U.S. Cl.
CPC ....... *H10K 50/865* (2023.02); *H10K 50/8426* (2023.02); *H10K 50/844* (2023.02);
(Continued)

(58) Field of Classification Search
CPC ............. H10K 50/865; H10K 50/8426; H10K 50/844; H10K 59/122; H10K 59/1315;
(Continued)

(56) References Cited

U.S. PATENT DOCUMENTS 9,685,626 B2 * 6/2017 Kim ................. H10K 50/84
9,996,205 B2 6/2018 Kang et al.
(Continued)

FOREIGN PATENT DOCUMENTS

KR 10-2018-0046708 5/2018
KR 10-2018-0082661 7/2018

*Primary Examiner* — Mohammed Shamsuzzaman
(74) *Attorney, Agent, or Firm* — CHAU & ASSOCIATES, LLC

(57) ABSTRACT

A display device includes a first substrate including a display area and a peripheral area outside the display area, pixels arranged in the display area and each including an emission area defined by a non-emission area, a thin-film encapsulation layer covering the pixels and including at least one inorganic encapsulation layer and at least one organic encapsulation layer, a pattern layer above the thin-film encapsulation layer, the pattern layer including a first light-blocking pattern shielding at least a portion of the non-emission area, and a second substrate facing the first substrate and including a second light-blocking pattern shielding at least a portion of the non-emission area.

9 Claims, 10 Drawing Sheets

(51) Int. Cl.
 H10K 50/844 (2023.01)
 H10K 59/122 (2023.01)
 H10K 59/131 (2023.01)
 H10K 59/38 (2023.01)
 H10K 59/40 (2023.01)

(52) U.S. Cl.
 CPC ....... H10K 59/122 (2023.02); H10K 59/1315 (2023.02); H10K 59/38 (2023.02); H10K 59/40 (2023.02)

(58) Field of Classification Search
 CPC .... H10K 59/38; H10K 59/40; H10K 50/8428; H10K 59/124; H10K 59/126; H10K 2102/331; H10K 59/35; H10K 59/1213; H10K 59/123; H10K 50/115; H10K 50/8445; H10K 59/00
 See application file for complete search history.

(56) References Cited

U.S. PATENT DOCUMENTS

| | | | |
|---|---|---|---|
| 10,600,859 B2* | 3/2020 | Park | G09G 3/3233 |
| 10,720,486 B2* | 7/2020 | Lhee | H10K 50/844 |
| 10,854,690 B2* | 12/2020 | Bae | H10K 59/60 |
| 10,903,446 B2* | 1/2021 | Son | H10K 59/38 |
| 10,923,538 B2* | 2/2021 | Lee | H10K 50/828 |
| 10,930,887 B2* | 2/2021 | Lee | H10K 71/00 |
| 2015/0185942 A1* | 7/2015 | Kim | H10K 59/40 345/173 |
| 2016/0308172 A1* | 10/2016 | Ahn | H10K 59/805 |
| 2017/0045782 A1* | 2/2017 | Cho | G02F 1/1339 |
| 2017/0154942 A1* | 6/2017 | Kim | H10K 59/126 |
| 2017/0244069 A1* | 8/2017 | Kim | H10K 50/856 |
| 2018/0061899 A1* | 3/2018 | Oh | H10K 59/124 |
| 2018/0122836 A1* | 5/2018 | Kang | H01L 33/60 |
| 2018/0174519 A1* | 6/2018 | Kim | H01L 33/06 |
| 2018/0197921 A1* | 7/2018 | Kim | H10K 50/865 |
| 2018/0366520 A1* | 12/2018 | Gwon | H10K 50/8445 |
| 2019/0056613 A1* | 2/2019 | Wang | G02F 1/163 |
| 2019/0131359 A1* | 5/2019 | Kong | G02F 1/136286 |
| 2019/0229175 A1* | 7/2019 | Lhee | H10K 59/88 |
| 2020/0194532 A1* | 6/2020 | Lee | G09G 3/3266 |
| 2020/0210006 A1* | 7/2020 | Son | H10K 50/844 |
| 2020/0274089 A1* | 8/2020 | Son | H10K 50/8428 |
| 2020/0295310 A1 | 9/2020 | Moon et al. | |
| 2021/0063801 A1* | 3/2021 | Park | G02F 1/134309 |

* cited by examiner

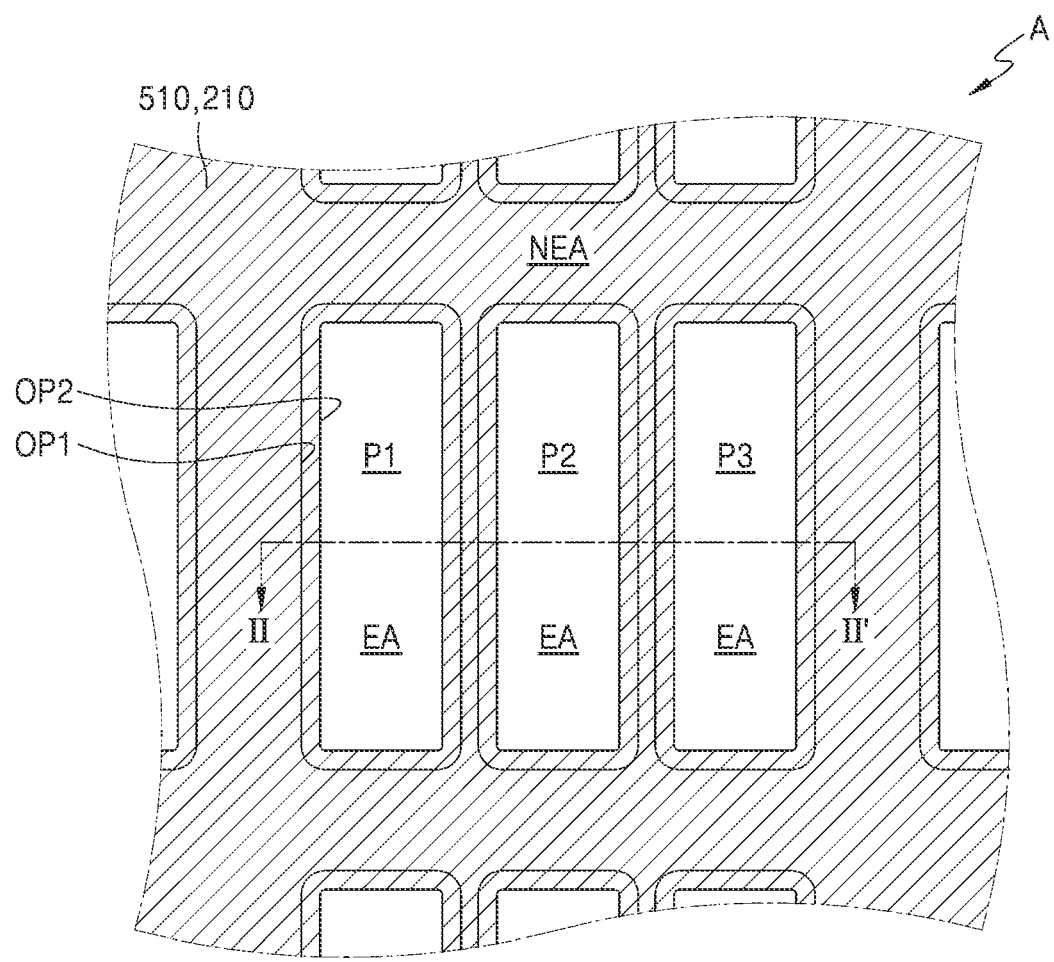

DISPLAY DEVICE

CROSS-REFERENCE TO RELATED APPLICATION

This application is a divisional of U.S. application Ser. No. 16/793,394 filed on Feb. 18, 2020, which claims priority under 35 U.S.C. § 119 to Korean Patent Application No. 10-2019-0028856, filed on Mar. 13, 2019, in the Korean Intellectual Property Office, the disclosure of which is incorporated by reference herein in its entirety.

BACKGROUND

1. Field

The present invention relates to a display device, more particularly, including a light-blocking pattern.

2. Description of the Related Art

Display devices visually display data. The display devices include a substrate divided into a display area and a peripheral area. A scan line and a data line that are insulated from each other are provided in the display area, and a plurality of pixels are included in the display area. Also, a thin film transistor and a pixel electrode are provided in the display area, the thin film transistor corresponding to each of the pixels, and the pixel electrode being electrically connected to the thin film transistor. Also, an opposite electrode may be provided in the display area, the opposite electrode being provided in common to the pixels. Various wirings, a scan driver, a data driver, a controller, etc. that transfer an electrical signal to the display area may be provided in the peripheral area.

The purpose of the display devices has been diversified. Accordingly, design that improves the quality of a display device is being tried variously.

SUMMARY

One or more embodiments include a display device in which light leakage does not occur in a display area that displays an image. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to an exemplary embodiment of the present invention, a display device includes a first substrate including a display area and a peripheral area outside the display area, the display area including a plurality of emission areas and a non-emission area defining each emission area, a plurality of pixels arranged in the display area, each of the plurality of pixels being disposed in a corresponding emission area, a thin-film encapsulation layer covering the plurality of pixels and including at least one inorganic encapsulation layer and at least one organic encapsulation layer, a pattern layer above the thin-film encapsulation layer, the pattern layer including a first light-blocking pattern shielding a portion of the non-emission area, and a second substrate facing the first substrate and including a second light-blocking pattern shielding the portion of the non-emission area.

The pattern layer further includes a first opening that is vertically aligned to a corresponding emission area, the second light-blocking pattern includes a second opening that is vertically aligned to the corresponding emission area, and an area of the first opening is greater than an area of the second opening.

The display device further includes a plurality of quantum emission layers disposed on the second substrate. Each of the quantum emission layers being vertically aligned to a corresponding emission area and including a quantum dot.

The plurality of pixels include a first pixel, a second pixel, and a third pixel. The quantum emission layers include a first quantum emission layer, a second quantum emission layer. The first quantum emission layer that is vertically aligned to the first pixel emits red light. The second quantum emission layer that is vertically aligned to the second pixel emits green light.

The display device further include a plurality of color filters disposed on the second substrate, each of the color filters being vertically aligned to a corresponding emission area.

The display device further includes a sealing member arranged in the peripheral area. The first substrate and the second substrate may be attached to each other by the sealing member.

The first light-blocking pattern includes metal.

The second light-blocking pattern includes a black matrix including a black pigment.

The display device further includes a dam unit arranged in the peripheral area and protruding from a top surface of the first substrate.

The display device further includes a support arranged outside the dam unit and protruding from the top surface of the first substrate. A height of the support from the top surface of the first substrate is less than a height of the dam unit from the top surface of the first substrate.

According to an exemplary embodiment of the present invention, a display device includes a first substrate including a display area and a peripheral area outside the display area, a plurality of pixels arranged in the display area and including a plurality of organic light-emitting diodes, respectively, each of the plurality of organic light-emitting diodes including a pixel electrode, an intermediate layer, and an opposite electrode, a pixel-defining layer including a third opening defining an emission area and a non-emission area surrounding the third opening and covering edges of the pixel electrode, the third opening exposing a central portion of the pixel electrode of each of the plurality of organic light-emitting diodes, a thin-film encapsulation layer covering the plurality of organic light-emitting diodes and including a first organic encapsulation layer, an organic encapsulation layer, and a second organic encapsulation layer that are sequentially stacked, a pattern layer above the thin-film encapsulation layer, the pattern layer including a first light-blocking pattern shielding at least a portion of an area between two adjacent organic light-emitting diodes of the plurality of organic light-emitting diodes, and a second substrate facing the first substrate and including a second light-blocking pattern that is vertically aligned to the first light-blocking pattern.

The plurality of organic light-emitting diodes emit blue light.

The display device further includes a plurality of first quantum emission layers each of which being vertically aligned to a corresponding organic light-emitting diode of the plurality of organic light-emitting diodes and including a quantum dot that emits red light and a plurality of second quantum emission layers each of which being vertically aligned to a corresponding organic light-emitting diode of the plurality of organic light-emitting diodes and including a quantum dot that emits green light.

The display device further includes a plurality of quantum emission layers disposed on the second substrate, each of the quantum emission layers being vertically aligned to a corresponding one of the plurality of organic light-emitting diodes and including a quantum dot.

The pattern layer includes a first opening that is vertically aligned to the emission area, the second light-blocking pattern includes a second opening that is vertically aligned to the emission area, and an area of the first opening is greater than an area of the second opening.

The first light-blocking pattern includes metal, and the second light-blocking pattern includes a black matrix including a black pigment.

The display device further includes a color filter disposed on the second substrate, the color filter being vertically aligned to the emission area.

The display device further includes a buffer layer arranged between the thin-film encapsulation layer and the pattern layer, the buffer layer being disposed on the peripheral area and the display area, a terminal arranged in the peripheral area, a contact hole passing through the buffer layer to expose the terminal.

The display device further includes an additional terminal layer contacting the terminal through the contact hole. The additional terminal layer includes a same material as that of the first light-blocking pattern.

The display device further includes a dam unit arranged in the peripheral area and protruding from a top surface of the first substrate; and a sealing member arranged outside the dam unit and sealing the first substrate and the second substrate to each other.

According to an exemplary embodiment of the present invention, a display device includes a first substrate including a display area and a peripheral area outside the display area, a plurality of organic light-emitting diodes in the display area, each of the plurality of organic light-emitting diodes including a pixel electrode, an intermediate layer, and an opposite electrode, a thin-film encapsulation layer covering the plurality of organic light-emitting diodes and including a first inorganic encapsulation layer, an organic encapsulation layer, and a second inorganic encapsulation layer that are sequentially stacked, a buffer layer arranged on the thin-film encapsulation layer and covering the display area and the peripheral area, a pattern layer on the buffer layer, the pattern layer including a first light-blocking pattern shielding at least a portion of an area between two adjacent organic light-emitting diodes of the plurality of organic light-emitting diodes, and a terminal arranged in the peripheral area. The buffer layer includes an additional contact hole that exposes the terminal.

BRIEF DESCRIPTION OF THE DRAWINGS

These and/or other aspects will become apparent and more readily appreciated from the following description of the embodiments, taken in conjunction with the accompanying drawings in which:

FIG. 3 is a plan view of a portion of a display device according to an exemplary embodiment of the present invention;

DETAILED DESCRIPTION

Figure 1:
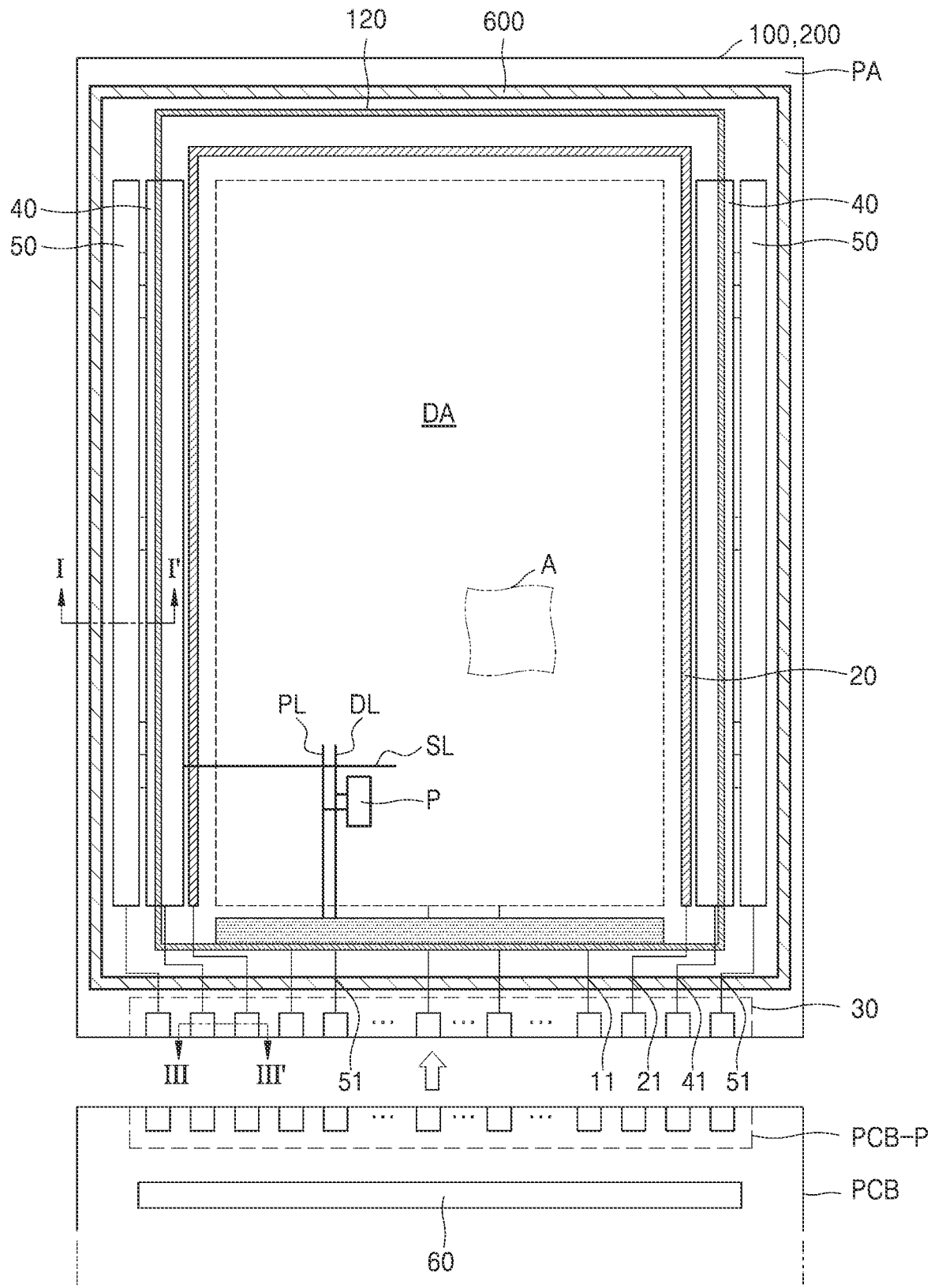
FIG. 1 is a plan view of a display device according to an exemplary embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

A display device is an apparatus for displaying an image and may include an organic light-emitting display, an inorganic light-emitting display, a quantum dot light-emitting display, a field emission display, a surface-conduction electron-emitter display, and a plasma display.

Hereinafter, although a display device according to an embodiment is described by using an organic light-emitting display device as an example, a display device according to an embodiment is not limited thereto and various types of display devices may be used.

FIG. 1 is a plan view of a display device according to an exemplary embodiment.

Referring to FIG. 1, the display device may be formed by attaching a first substrate 100 and a second substrate 200 through a sealing member 600. The sealing member 600 may surround the outer periphery of the first substrate 100 and the second substrate 200 and attach the first substrate 100 to the second substrate 200.

The display device includes a display area DA and a peripheral area PA outside the display area DA. The display device may display a predetermined image by using light emitted from a plurality of pixels arranged in the display area DA.

The display area DA includes pixels P connected to a data line DL and a scan line SL, the data line extending in a first direction, and the scan line SL extending in a second direction intersecting with the first direction. Each pixel P is also connected to a driving voltage line PL extending in the first direction.

Each of the pixels P may include a display element such as an organic light-emitting diode OLED. Each pixel P may emit, for example, red, green, blue, or white light through the organic light-emitting diode OLED. In the present specification, a pixel P may be understood as a pixel that emits red, green, blue, or white light as described above.

Each pixel P may be electrically connected to built-in circuits arranged in the peripheral area PA. A built-in driving circuit unit 40, a wiring unit 50, a terminal unit 30, a first power supply line 10, and a second power supply line 20 may be arranged in the peripheral area PA.

The built-in driving circuit unit 40 may include a plurality of thin film transistors and provide a scan signal to each pixel P through a scan line SL. The built-in driving circuit units 40 may be arranged on two opposite sides with the display area DA therebetween. Some of the pixels P arranged in the display area DA may be electrically connected to the built-in driving circuit unit 40 arranged on the left, and the rest of the pixels P may be electrically connected to the built-in driving circuit unit 40 arranged on the right. The present invention is not limited thereto. In an exemplary embodiment, the built-in driving circuit unit 40 may be arranged on only one side of the display area DA.

The wiring unit 50 is arranged on one side of the built-in driving circuit unit 40. The wiring unit 50 denotes a region in which wirings transferring a signal for driving the built-in driving circuit unit 40 are arranged.

The terminal unit 30 may be arranged on one side of the first substrate 100. The terminal unit 30 may be exposed without being covered by an insulating layer and electrically connected to a printed circuit board PCB. A terminal PCB-P of the printed circuit board PCB may be electrically connected to the terminal unit 30.

The printed circuit board PCB transfers a signal or power of a controller (not shown) to the terminal unit 30. The controller may respectively provide a driving voltage ELVDD and a common ELVSS (see FIGS. 2A and 2B below) to the first power supply line 10 and the second power supply line 20 through a first connection line 11 and a second connection line 21. The driving voltage ELVDD may be provided to each pixel P through the driving voltage line PL connected to the first power supply line 10, and the common voltage ELVSS may be provided to the opposite electrode of a pixel P connected to the second power supply line 20. The second power supply line 20 may have a loop shape having one open side and partially surround the display area DA. The second power supply line 20 may be arranged between the built-in driving circuit unit 40 and the display area DA. Since the second power supply line 20 provides the common voltage ELVSS, it may be called a common voltage supply line.

A control signal generated by the controller may be transferred to the built-in driving circuit unit 40 and the wiring unit 50 through the printed circuit board PCB and a third connection line 41 and a fourth connection line 51. Also, a signal transferred to the wiring unit 50 may be transferred to the built-in driving circuit unit 40.

A data driving circuit 60 is electrically connected to a data line DL. A data signal of the data driving circuit 60 may be provided to each pixel P through a data connection line 61 and the data line DL, the data connection line 61 being connected to the terminal unit 30, and the data line DL being connected to the data connection line 61. Though it is shown in FIG. 1 that the data driving circuit 60 is arranged in the printed circuit board PCB, the data driving circuit 60 may be arranged on the first substrate 100. For example, the data driving circuit 60 may be arranged between the terminal unit 30 and the first power supply line 10.

A dam unit 120 may be arranged in the peripheral area PA. The dam unit 120 may prevent an edge tail of an organic encapsulation layer 420 (see FIG. 4) from being formed by blocking flowing of an organic material in an edge direction of the first substrate 100 while the organic encapsulation layer 420 of a thin-film encapsulation layer 400 is formed. The dam unit 120 in the peripheral area PA may surround at least a portion of the display area DA. The dam unit 120 may include a plurality of dams. In the case where the plurality of dams are arranged, the dams may be spaced apart from each other. The dam unit 120 may be arranged closer to the display area DA than the sealing member 600 in the peripheral area PA.

At least a portion of the dam unit 120 overlaps the built-in driving circuit unit 40. The present invention is not limited thereto. In an exemplary embodiment, a portion of the dam unit 120 may overlap the wiring unit 50. Since the dam unit 120 overlaps the built-in driving circuit unit 40 and/or the wiring unit 50, the dam unit 120 may be arranged without occupying a separate region for the dam unit 120. Therefore, a size of the peripheral area PA may be reduced.

However, the present embodiment is not limited thereto. The dam unit 120 may not overlap the built-in driving circuit unit 40 and the wiring unit 50.

Figure 2A:
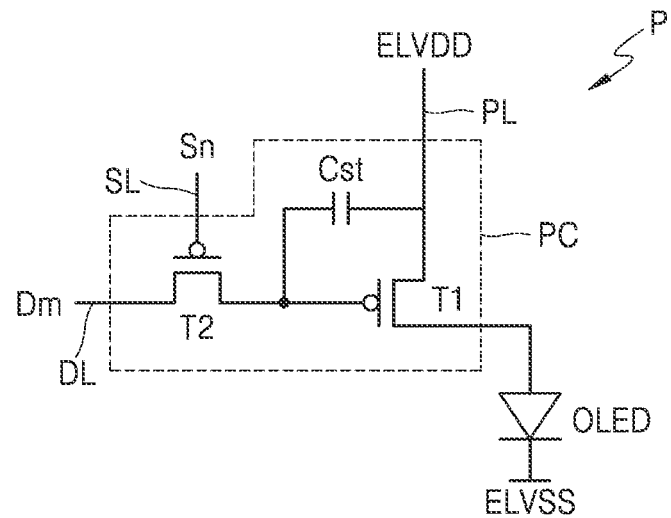
FIG. 2A is an equivalent circuit diagram of a pixel of the display device of FIG. 1 according to an exemplary embodiment of the present invention.
Figure 2B:
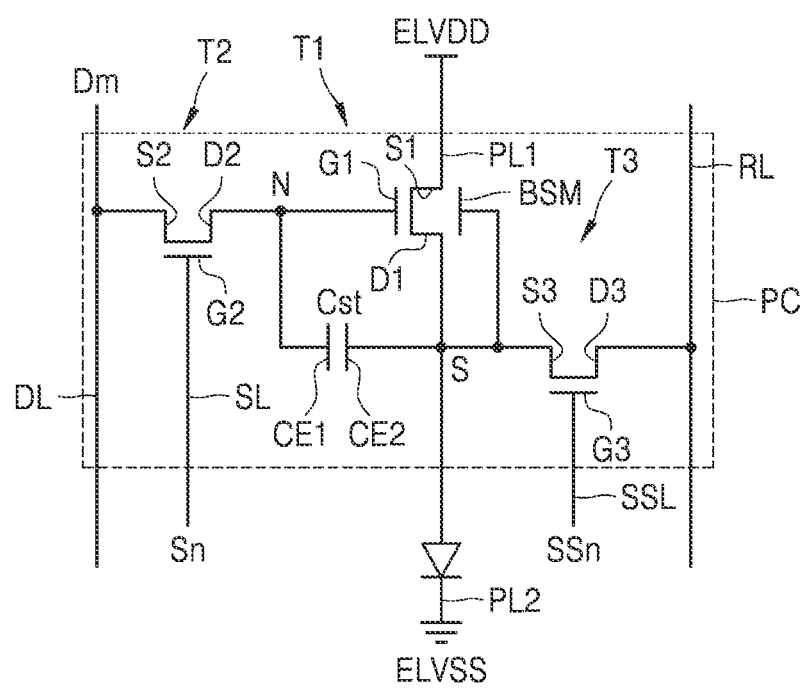
FIG. 2B is an equivalent circuit diagram of a pixel of the display device of FIG. 1 according to an exemplary embodiment of the present invention.

FIGS. 2A and 2B are equivalent circuit diagrams of one of the pixels of the display device of FIG. 1 according to an exemplary embodiment.

Referring to FIG. 2A, a pixel P includes a pixel circuit PC and an organic light-emitting diode OLED, the pixel circuit PC being connected to a scan line SL and a data line DL, and the organic light-emitting diode OLED being connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 in response to a scan signal Sn input through the scan line SL.

The storage capacitor Cst is connected to the switching thin film transistor T2 and the driving voltage line PL and stores a voltage corresponding to a voltage difference between a voltage transferred from the switching thin film transistor T2 and the first power voltage ELVDD (or a driving voltage) supplied to the driving voltage line PL.

The driving thin film transistor T1 is connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having predetermined brightness by using the driving current.

Though it is shown in FIG. 2A that the pixel circuit PC includes two thin film transistors and one storage capacitor, the present invention is not limited thereto.

Referring to FIG. 2B, a pixel PX includes the organic light-emitting diode OLED and the pixel circuit PC including a plurality of thin film transistors driving the organic light-emitting diode OLED. The pixel circuit PC includes the driving thin film transistor T1, the switching thin film transistor T2, a sensing thin film transistor T3, and the storage capacitor Cst.

The scan line SL is connected to a gate electrode G2 of the switching thin film transistor T2, the data line DL is connected to a source electrode S2, and a first electrode CE1 of the storage capacitor Cst may be connected to a drain electrode D2.

Therefore, the switching thin film transistor T2 supplies a data voltage of the data line DL to a first node N in response to a scan signal Sn from the scan line SL of the pixel P.

A gate electrode G1 of the driving thin film transistor T1 is connected to the first node N, a source electrode S1 is connected to a first power line PL1 transferring the driving power voltage ELVDD, and a drain electrode D1 is connected to an anode electrode of the organic light-emitting diode OLED.

Therefore, the driving thin film transistor T1 may adjust a current amount flowing through the organic light-emitting diode OLED depending on a source-gate voltage Vgs of the driving thin film transistor T1, that is, a voltage applied between the driving power voltage ELVDD and the first node N.

A gate electrode G3 of the sensing thin film transistor T3 is connected to a sensing control line SSL, a source electrode S3 is connected to a second node S, and a drain electrode D3 is connected to a reference voltage line RL. The present invention is not limited thereto. In an exemplary embodiment, the sensing thin film transistor T3 may be controlled by the scan line SL instead of the sensing control line SSL.

The sensing thin film transistor T3 may sense an electric potential of the anode electrode of the organic light-emitting diode OLED. The sensing thin film transistor T3 supplies a pre-charging voltage from the reference voltage line RL to the second node S in response to a sensing signal SSn from the sensing control line SSL or supplies a voltage of the anode electrode AD of the organic light-emitting diode OLED to the reference voltage line RL for a sensing period.

The first electrode CE1 of the storage capacitor Cst is connected to the first node N, and a second electrode CE2 of the storage capacitor Cst is connected to the second node S. The storage capacitor Cst is charged with a voltage difference between a voltage supplied to the first node N and a voltage supplied to the second node S and supplies the charged voltage difference as a driving voltage of the driving thin film transistor T1. For example, the storage capacitor Cst may be charged with a voltage difference between a voltage of the data signal Dm supplied to the first node and the driving power voltage ELVDD supplied to the second node S.

A bias electrode BSM is formed to correspond to the driving thin film transistor T1 and connected to the source electrode S3 of the sensing thin film transistor T3. Since the bias electrode BSM is supplied with a voltage in cooperation with an electric potential of the source electrode S3 of the sensing thin film transistor T3, the driving thin film transistor T1 may be stabilized. The present invention is not limited thereto. In an exemplary embodiment, the bias electrode BSM may not be connected to the source electrode S3 of the sensing thin film transistor T3 and may be connected to a separate bias line.

The opposite electrode (e.g. a cathode) of the organic light-emitting diode OLED receives the common power voltage ELVSS. The organic light-emitting diode OLED emits light by receiving the driving current from the driving thin film transistor T1.

Though it is shown in FIG. 2B that the pixel P includes the signal lines SL, SSL, and DL, the reference voltage line RL, the first power line PL1, and a second power line PL2, the present invention is not limited thereto. For example, at least one of the signal lines SL, SSL, and DL, and/or the reference voltage line RL, the first power line PL1, and the second power line PL2 may be shared by neighboring pixels.

The pixel circuit PC is not limited to the number of thin film transistors, the number of storage capacitors, and the circuit design described with reference to FIGS. 2A and 2B, and the number and the circuit design may be variously modified.

Figure 4:
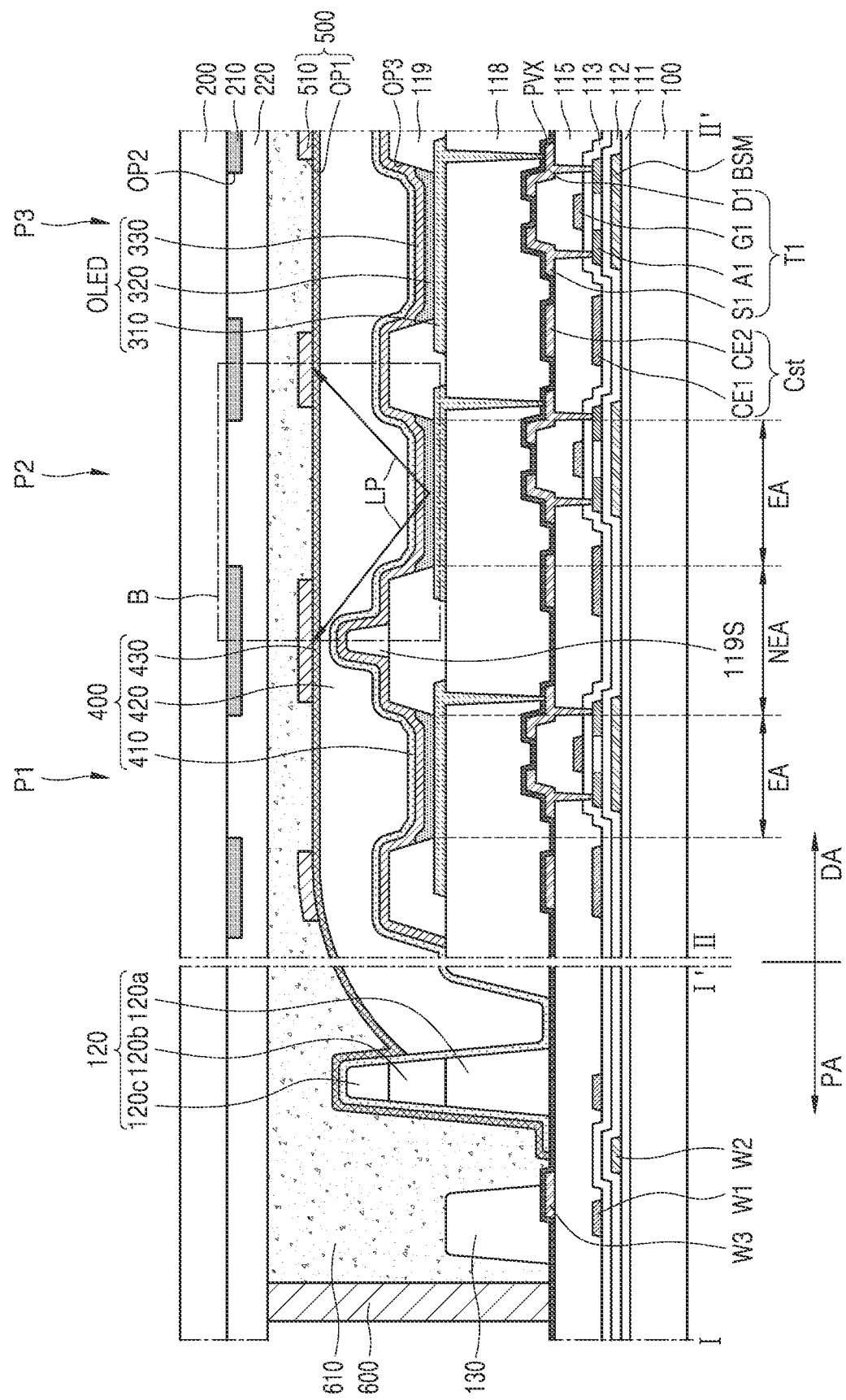
FIG. 4 is a cross-sectional view of a portion of a display device taken line I-I' of FIG. 1 and line II-II' of FIG. 3 according to an exemplary embodiment of the present invention.
Figure 5:
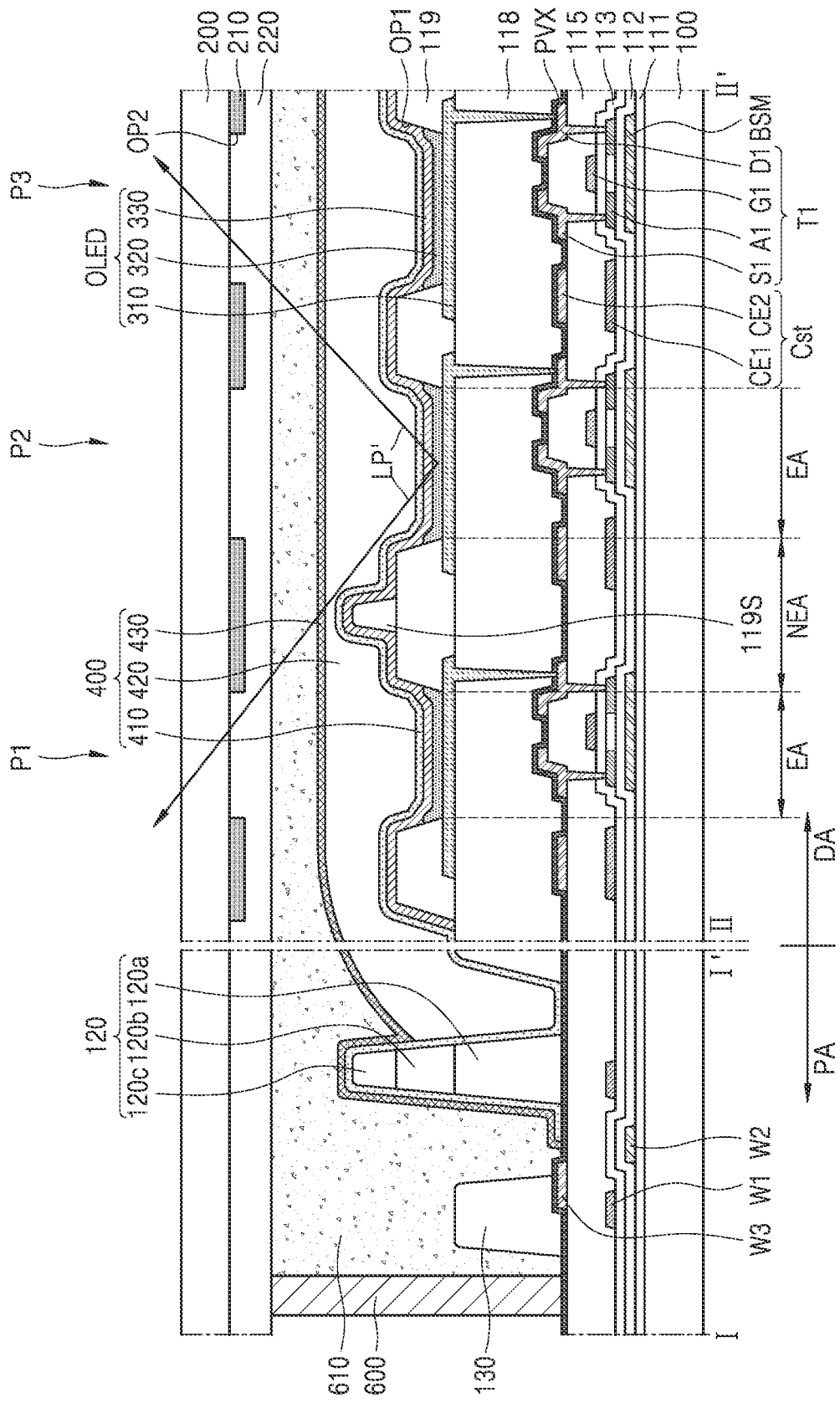
FIG. 5 is a cross-sectional view of a comparative example for comparison with an embodiment.

FIG. 3 is a plan view of a portion of a display device according to an exemplary embodiment and corresponds to a region A of FIG. 1. FIG. 4 is a cross-sectional view of a portion of a display device according to an exemplary embodiment and corresponds to line I-I' of FIG. 1 and line II-II' of FIG. 3. FIG. 5 is a cross-sectional view of a comparative example for comparison with an exemplary embodiment.

Referring to FIGS. 3 and 4, the display device according to an exemplary embodiment includes the display area DA and the peripheral area PA outside the display area DA. In an exemplary embodiment, the peripheral area PA may surround the display area DA. At least one thin film transistor T1 and a display element connected to the thin film transistor T1 may be arranged in the display area DA. The dam unit 120, a support 130, and the sealing member 600 are arranged in the peripheral area PA.

In an exemplary embodiment of the present invention, the display area DA of the display device includes a plurality of pixels, that is, a first pixel P1, a second pixel P2, and a third pixel P3, each pixel including a corresponding emission area of a plurality of emission areas EA. Each of the emission areas EA may include an area in which light is generated and emitted to the outside. A non-emission area NEA may be arranged between the emission areas EA. For example, the emission areas EA of the pixels P1, P2, and P3 may be separately defined by the non-emission area NEA. In an exemplary embodiment, the display area DA may include the plurality of emission areas EA and the non-emission area NEA. The non-emission area NEA may surround each of the plurality of emission areas EA. Each of the plurality of pixels may be disposed in a corresponding emission area of the plurality of emission areas EA.

In FIG. 3, the first pixel P1, the second pixel P2, and the third pixel P3 may respectively produce different lights. For example, the first pixel P1 may produce red light, the second pixel P2 may produce green light, and the third pixel P3 may produce blue light. In the drawing, though the emission areas of the first pixel P1, the second pixel P2, and the third pixel P3 have a rounded rectangular shape and are arranged in a stripe, the present invention is not limited thereto. The emission area EA of each pixel may have various polygonal shapes or a circular shape and may be arranged in various configurations such as a pentile arrangement.

The display device according to an exemplary embodiment of the present invention includes a pattern layer 500 including a first opening OP1 and a first light-blocking pattern 510, the first opening OP1 exposing the emission area EA, and the first light-blocking pattern 510 shielding the non-emission area NEA. For example, the first opening OP1 is vertically aligned with the emission area EA such that the first opening OP1 and the emission area EA, when viewed in a plan view, overlap each other, and the first light-blocking pattern 510 and the non-emission area NEA, when viewed in a plan view, overlap each other. Also, the display device according to an exemplary embodiment of the present embodiment includes the second substrate 200 on which a second opening OP2 and a second light-blocking pattern 210 are formed, the second opening OP2 corresponding to the first opening OP1, and the second light-blocking pattern 210 corresponding to the non-emission area NEA. For example, the second opening OP2 is vertically aligned with the first opening OP1 such that the first opening OP1 and the second opening OP2, when viewed in a plan view, overlap each other, and the second light-blocking pattern 210 and the first light-blocking pattern 510, when viewed in a plan view, overlap each other. In an exemplary embodiment, the first opening OP1 and the second opening OP2 are vertically aligned with the emission area EA such that light emitted therefrom may travel through the first opening OP1 and the second opening OP2. The first light-blocking pattern 510 and the second light-blocking pattern 210 are vertically aligned with the non-emission area NEA such that some light emitted from the emission area EA is blocked.

Hereinafter, the display device of an exemplary embodiment is described in detail according to a stacking sequence shown in FIG. 4.

The display area DA of FIG. 4 shows the driving thin film transistor T1 and the storage capacitor Cst of the pixel circuit PC of the pixel P described with reference to FIGS. 2A and 2B. For convenience of description, a configuration arranged in the display area DA of FIG. 4 is described according to a stacking sequence.

The first substrate 100 may include a glass material, a ceramic material, a metal material, or a flexible or bendable material. In the case where the first substrate 100 includes a flexible or bendable material, the first substrate 100 may include a polymer resin such as polyethersulfone, polyacrylate, polyetherimide, polyethylene naphthalate, polyethylene terephthalate, polyphenylene sulfide, polyarylate, polyacrylate, polyimide, polycarbonate, or cellulose acetate propionate. The first substrate 100 may have a single-layered or multi-layered structure including the above materials. In the case where the first substrate 100 has a multi-layered structure, the first substrate 100 may further include an inorganic layer. In an exemplary embodiment, the first substrate 100 may have a structure including an organic material/inorganic material/organic material.

A barrier layer (not shown) may be further arranged between the first substrate 100 and a first buffer layer 111. The barrier layer may prevent or minimize penetration of impurities into a semiconductor layer A1 from the first substrate 100. The barrier layer may include an inorganic material such as an oxide or a nitride, or an organic material, or an organic/inorganic composite material and have a single-layered or multi-layered structure including an inorganic material and an organic material.

The bias electrode BSM is arranged on the first buffer layer 111 to correspond to the driving thin film transistor T1. For example, the bias electrode BSM is disposed under the driving thin film transistor T1. A voltage may be applied to the bias electrode BSM. For example, the source electrode S3 (see FIG. 2B) of the sensing thin film transistor T3 (see FIG. 2B) may be connected to the bias electrode BSM and thus a voltage of the source electrode S3 may be applied to the bias electrode BSM. Also, the bias electrode BSM may prevent external light from reaching the semiconductor layer A1. Therefore, a characteristic of the driving thin film transistor T1 may be stabilized. The bias electrode BSM may be omitted depending on a case.

A second buffer layer 112 covers the bias electrode BSM. The second buffer layer 112 may be formed on an entire surface of the first substrate 100. The second buffer layer 112 may include $SiO_2$, $SiN_x$, SiON, $Al_2O_3$, $TiO_2$, $Ta_2O_5$, $HfO_2$, or $ZnO_2$.

The semiconductor layer A1 is arranged on the second buffer layer 112. The semiconductor layer A1 may include amorphous silicon or polycrystalline silicon. The present invention is not limited thereto. In an exemplary embodiment, the semiconductor layer A1 may include an oxide of at least one of In, Ga, Sn, Zr, V, Hf, Cd, Ge, Cr, Ti, Al, Cs, Ce, and Zn. For example, the semiconductor layer A1 may include, as a Zn oxide-based material, Zn oxide, In—Zn oxide, and Ga—In—Zn oxide. For another example, the semiconductor layers A1 may include a semiconductor including IGZO (In—Ga—Zn—O), ITZO (In—Sn—Zn—O), or IGTZO (In—Ga—Sn—Zn—O) in which ZnO contains metal such as In, Ga, or Sn. The semiconductor layer A1 may include a channel region, and a source region and a drain region respectively arranged on two opposite sides of the channel region. The semiconductor layer A1 may include a single layer or a multi-layer.

The gate electrode G1 is arranged over the semiconductor layer A1 with a gate insulating layer 113 therebetween such that the gate electrode G1 overlaps at least a portion of the semiconductor layer A1. The gate electrode G1 may include at least one of Mo, Al, Cu, and Ti and may include a single layer or a multi-layer. For example, the gate electrode G1 may include a single layer including Mo. The first electrode CE1 of the storage capacitor Cst may be arranged on the same layer on which the gate electrode G1 is arranged. The first electrode CE1 may include the same material as that of the gate electrode G1.

An interlayer insulating layer 115 covers the gate electrode G1 and the first electrode CE1 of the storage capacitor Cst. The interlayer insulating layer 115 may include $SiO_2$, $SiN_x$, SiON, $Al_2O_3$, $TiO_2$, $Ta_2O_5$, $HfO_2$, or $ZnO_2$.

The second electrode CE2 of the storage capacitor Cst, the source electrode S1, the drain electrode D1, and the data line DL are arranged on the interlayer insulating layer 115.

The second electrode CE2 of the storage capacitor Cst, the source electrode S1, the drain electrode D1, and the data line DL may include a conductive material including Mo, Al, Cu, or Ti and include a single layer or a multi-layer including the above materials. For example, the second electrode CE2, the source electrode S1, the drain electrode D, and the data line DL may include a multi-layered structure of Ti/Al/Ti. The source electrode S1 and the drain electrode D1 may be connected to a source region and a drain region of the semiconductor layer A1 through a contact hole, respectively.

The second electrode CE2 of the storage capacitor Cst overlaps the first electrode CE1 with the interlayer insulating layer 115 therebetween and forms a capacitance in cooperation with the first electrode CE1. In this case, the interlayer insulating layer 115 may serve as a dielectric layer of the storage capacitor Cst.

The second electrode CE2 of the storage capacitor Cst, the source electrode S1, the drain electrode D1, and the data line DL are covered by an inorganic protective layer PVX.

The inorganic protective layer PVX may include a single layer or a multi-layer including $SiN_x$ and $SiO_x$. The inorganic protective layer PVX may cover and protect some of wirings arranged on the interlayer insulating layer 115. Wirings (not shown) simultaneously formed with the data line DL during the same process of forming the data line DL may be exposed to a partial area (e.g. a portion of the peripheral area PA) of the first substrate 100. An exposed portion of the wirings may be damaged by etchant used while the pixel electrode 310 is patterned. Since the inorganic protective layer PVX covers the data line DL and at least some of the wirings simultaneously formed with the data line DL as in an exemplary embodiment of the present invention, the damage of the wirings may be prevented during a patterning operation of the pixel electrode 310.

A planarization layer 118 is arranged on the inorganic protective layer PVX, and the organic light-emitting diode OLED is arranged on the planarization layer 118.

The planarization layer 118 may include a single layer or a multi-layer including an organic material and provide a flat top surface. The planarization layer 118 may include a general-purpose polymer such as benzocyclobutene (BCB), polyimide, hexamethyldisiloxane (HMDSO), polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The organic light-emitting diode OLED is arranged on the planarization layer 118 in the display area DA of the first substrate 100. The organic light-emitting diode OLED includes the pixel electrode 310, an intermediate layer 320, and an opposite electrode 330, the intermediate layer 320 including an organic emission layer.

The pixel electrode 310 may include a transparent electrode, a semi-transparent electrode or a reflective electrode. In an exemplary embodiment, the pixel electrode 310 may include a reflective layer and a transparent or semi-transparent electrode layer on the reflective layer, the reflective layer including Ag, Mg, Al, Pt, Pd, Au, Ni, Nd, Ir, Cr, or a compound thereof. The transparent or semi-transparent electrode layer may include at least one of indium tin oxide (ITO), zinc oxide (IZO), zinc oxide (ZnO), indium oxide ($In_2O_3$), indium gallium oxide (IGO), and aluminum zinc oxide (AZO). In an exemplary embodiment, the pixel electrode 310 may have a structure of ITO/Ag/ITO.

A pixel-defining layer 119 is arranged on the planarization layer 118. The pixel-defining layer 119 defines an emission area of the pixel P by including an opening corresponding to each of sub-pixels in the display area DA, that is, a third opening OP3 that exposes at least a central portion of the pixel electrode 310. Also, the pixel-defining layer 119 may prevent an arc, etc. from occurring at an edge of the pixel electrode 310 by increasing a distance between the edge of the pixel electrode 310 and the opposite electrode 330 over the pixel electrode 310.

The pixel-defining layer 119 may include at least one of organic insulating materials including polyimide, polyamide, an acrylic resin, BCB, or a phenolic resin and may be formed by spin coating, etc.

The intermediate layer 320 of the organic light-emitting diode OLED may include an organic emission layer. The organic emission layer may include an organic material including a fluorescent or phosphorescent material which emits red, green, blue, or white light. The organic emission layer may include a low molecular weight or polymer organic material. A functional layer such as a hole transport layer (HTL), a hole injection layer (HIL), an electron transport layer (ETL), and an electron injection layer (EIL) may be selectively further arranged under and on the organic emission layer. The intermediate layer 320 may correspond to each of the plurality of pixel electrodes 310. For example, the intermediate layer 320 may be separately formed on a corresponding pixel electrode of the plurality of pixel electrodes 310. However, the present invention is not limited thereto. In an exemplary embodiment, the intermediate layer 320 may include a single layer provided as one body over the plurality of pixel electrodes 310. Various modifications may be made.

The opposite electrode 330 may include a light-transmissive electrode or a reflective electrode. In an exemplary embodiment, the opposite electrode 330 may include a transparent or semi-transparent electrode and may include a metal thin film having a small work function and including at least one of Li, Ca, LiF/Ca, LiF/Al, Al, Ag, Mg, and a compound thereof. Also, a transparent conductive oxide (TCO) layer such as ITO, IZO, ZnO, or $In_2O_3$ may be further arranged on the metal thin film. The opposite electrode 330 may be arranged over the display area DA and the peripheral area PA and arranged over the intermediate layer 320 and the pixel-defining layer 119. The opposite electrode 330 may be provided as one body over a plurality of organic light-emitting diodes OLED and may correspond to the plurality of pixel electrodes 310.

A spacer 119S for preventing mask chopping may be further provided on the pixel-defining layer 119. The spacer 119S may be provided as one body with the pixel-defining layer 119. For example, the spacer 119S and the pixel-defining layer 119 may be simultaneously formed by a half-tone mask process during the same process.

Since the organic light-emitting diode OLED may be easily damaged by external moisture, oxygen, etc., the organic light-emitting diode OLED may be covered and protected by the thin-film encapsulation layer 400. The thin-film encapsulation layer 400 may cover the display area DA and extend to the outside of the display area DA. The thin-film encapsulation layer 400 may include at least one organic encapsulation layer and at least one inorganic encapsulation layer. For example, the thin-film encapsulation layer 400 includes a first inorganic encapsulation layer 410, an organic encapsulation layer 420, and a second inorganic encapsulation layer 430.

The first inorganic encapsulation layer 410 may cover the opposite electrode 330 and include silicon oxide, silicon nitride, or tri-silicon oxynitride. Though not shown, when needed, other layers such as a capping layer may be arranged between the first inorganic encapsulation layer 410 and the opposite electrode 330. Since the first inorganic encapsulation layer 410 is formed along a structure thereunder, a top surface thereof is not flat. The organic encapsulation layer 420 covers the first inorganic encapsulation layer 410. Unlike the first inorganic encapsulation layer 410, a top surface of the organic encapsulation layer 420 may be approximately flat. Specifically, the top surface of the organic encapsulation layer 420 that corresponds to the display area DA may be approximately flat. The organic encapsulation layer 420 may include at least one of polyethylene terephthalate (PET), polyethylene naphthalate (PEN), polycarbonates (PC), polyimide (PI), polyethylene sulfonate, polyoxymethylene, polyarylate, and hexamethyldisiloxane (HMDSO). The second inorganic encapsulation layer 430 may cover the organic encapsulation layer 420 and include silicon oxide, silicon nitride and/or silicon tri-oxynitride.

Even when a crack occurs inside the thin-film encapsulation layer 400, the thin-film encapsulation layer 400 may prevent cracks from propagating to be connected to each other through such a multi-layered structure, the cracks occurring between the first inorganic encapsulation layer 410 and the organic encapsulation layer 420 or between the organic encapsulation layer 420 and the second inorganic encapsulation layer 430. In other words, forming of a path through which external moisture or oxygen may penetrate the display area DA may be prevented or minimized.

The pattern layer 500 is arranged on the thin-film encapsulation layer 400. The pattern layer 500 may include an element preventing light generated from an emission area EA of the first pixel P1 from being emitted to an emission area EA of the second pixel P2 that is adjacent thereto.

The pattern layer 500 includes the first light-blocking pattern 510 configured to shield at least a portion of the non-emission area NEA arranged between the emission areas EA of the first pixel P1, the second pixel P2, and the third pixel P3. Also, the pattern layer 500 further includes the first opening OP1 exposing an emission area EA. Lights generated from the emission areas EA of the first pixel P1, the second pixel P2, and the third pixel P3 may be emitted through the openings OP1.

The first light-blocking pattern 510 may include metal. For example, the first light-blocking pattern 510 may include a conductive material including Mo, Al, Cu, or Ti and include a single layer or a multi-layer including the above materials. For example, the first light-blocking pattern 510 may have a multi-layered structure of Ti/Al/Ti.

However, the present invention is not limited thereto. For example, the first light-blocking pattern 510 may include a black matrix including at least one of black pigment, black dye, and black particle.

In an exemplary embodiment, the second light-blocking pattern 210 is arranged on the second substrate 200 facing the first substrate 100. The second light-blocking pattern 210 may include a black matrix and include a member for increasing color saturation and contrast. The second light-blocking pattern 210 may include the second opening OP2 exposing the emission area EA. For example, the second opening OP2 vertically overlaps the emission area EA.

The second light-blocking pattern 210 may include a material that absorbs a visible light. The second light-blocking pattern 210 may include at least one of black pigment, black dye, and black particle. In an exemplary embodiment, the second light-blocking pattern 210 may include materials such as Cr or $CrO_x$, $Cr/CrO_x$, $Cr/CrO_x/CrN_y$, a resin (carbon pigment, RGB mixed pigment), graphite, or non-Cr-based materials.

A protective layer 220 is arranged on the second substrate 200 to cover the second light-blocking pattern 210. The protective layer 220 may include an inorganic material such as $SiO_2$, $SiN_x$, $SiON$, $Al_2O_3$, $TiO_2$, $Ta_2O_5$, $HfO_2$, or $ZnO_2$. The protective layer 220 may include an organic material such as PI or epoxy.

The second light-blocking pattern 210 may also block light coming from an emission area of a neighboring pixel. However, in the display device according to the present embodiment, since a member such as the thin-film encapsulation layer 400 is employed on the organic light-emitting diode OLED, an interval between the intermediate layer 320 and the second light-blocking pattern 210 may be large, the intermediate layer 320 emitting light.

Accordingly, in the case where there is no first light-blocking pattern 510 as in FIG. 5, which is a comparative example of the present invention, even though the second light-blocking pattern 210 is arranged on the second substrate 200, light LP' coming from the first pixel P1 may not be prevented from being emitted to the emission area EA of the second pixel P2 that is adjacent thereto.

In contrast, according to the present embodiment, light LP that is emitted in a direction of the second pixel P2 among lights generated from the organic light-emitting diode OLED of the first pixel P1 may be blocked by the first light-blocking pattern 510 arranged closer to the intermediate layer 320 than the second light-blocking pattern 210 and thus not be emitted to the emission area EA of the second pixel P2.

The built-in driving circuit unit 40 (see FIG. 1), the wiring unit 50, the dam unit 120, the support 130, and the sealing member 600 may be arranged in the peripheral area PA outside the display area DA.

The wiring unit 50 may include a first wiring W1, a second wiring W2, and a third wiring W3 that are arranged on the first substrate 100. The first wiring W1 and the second wiring W2 may be connected to the terminal unit 30 (see FIG. 1) to transfer a control signal supplied from the controller, and the third wiring W3 may transfer the control signal to the built-in driving circuit unit 40 (see FIG. 1).

The first wiring W1 may be arranged on the same layer as a layer on which the gate electrode G1 is arranged and may be simultaneously formed with the gate electrode G1 by using the same material as that of the gate electrode G1. For example, the first wiring W1 and the gate electrode G1 may be simultaneously formed on the gate insulating layer 113. In this case, the first wiring W1 and the gate electrode G1 may be formed using the same material. The second wiring W2 may be arranged on the same layer as a layer on which the bias electrode BSM is arranged and may be simultaneously formed with the bias electrode BSM by using the same material as that of the bias electrode BSM. For example, the second wiring W2 and the bias electrode BSM may be simultaneously formed on the first buffer layer 111. In this case, the second wiring W2 and the bias electrode BSM may be formed using the same material. The third wiring W3 may be arranged on the same layer as a layer on which the source electrode S1 or the drain electrode D1 is arranged and may be simultaneously formed with the source electrode S1 or the drain electrode D1 by using the same material as that of the source electrode S1 or the drain electrode D1. For example, the third wiring W3, the source electrode S1 and the drain electrode D1 may be formed on the interlayer insulating layer 115. In this case, the third wiring W3, the source electrode S1 and the drain electrode D1 may be formed using the same material.

The dam unit 120 is arranged outside the planarization layer 118 and the pixel-defining layer 119, each extending from the display area DA. The dam unit 120 is spaced apart from the planarization layer 118 and the pixel-defining layer 119. The dam unit 120 may prevent an organic material from flowing to an edge of the first substrate 100 while the organic encapsulation layer 420 of the thin-film encapsulation layer 400 is formed. In the case where the dam unit 120 is provided as a plurality of dam units, the plurality of dam units may be spaced apart from each other.

The dam unit 120 may have a single-layered or multi-layered structure. The dam unit 120 may have a structure in which a first layer 120a, a second layer 120b, and a third layer 120c are stacked.

In this case, the first layer 120a may be simultaneously formed with the planarization layer 118 by using the same material as that of the planarization layer 118. The second layer 120b may be simultaneously formed with the pixel-defining layer 119 by using the same material as that of the pixel-defining layer 119. The third layer 120c may be simultaneously formed with the spacer 119S by using the same material as that of the spacer 119S.

Since the first inorganic encapsulation layer 410 and the second inorganic encapsulation layer 430 of the thin-film encapsulation layer 400 directly contact each other outside the dam unit 120, the organic encapsulation layer 420 may not be exposed to the outside. That is, penetration of external air or moisture through the organic material may be prevented.

The inorganic protective layer PVX directly contacts the first inorganic encapsulation layer 410 in an inner region inside the dam unit 120, that is, a region adjacent to the display area DA. Since both the first inorganic encapsulation layer 410 and the inorganic protective layer PVX include an inorganic material, adhesive force may be reinforced. Also, since an organic material is not arranged in a region between the dam unit 120 and the support 130, moisture transmission of external air may be effectively prevented.

The support 130 is arranged outside the dam unit 120. The support 130 may include a member for supporting a mask used during a mask process. That is, a mask support may be provided to one side of the mask and may be engaged with the support 130 of the display device to support the mask. Since the support 130 may include an organic material, the support 130 may perform a buffering function in supporting the mask. The support 130 may not only support the mask but also suppress transfer of a crack onto the display area DA.

The support 130 has a structure protruding from a top surface of the first substrate 100 and may be called a protrusion. The support 130 may be simultaneously formed with the planarization layer 118 by using the same material as that of the planarization layer 118. The height of the support 130 may be less than that of the dam unit 120. The support 130 may overlap at least a portion of the wiring unit 50. Therefore, a size of the peripheral area PA may be reduced.

The sealing member 600 is arranged outside the support 130 to attach the first substrate 100 to the second substrate 200. The sealing member 600 may surround the outer side of the peripheral area PA in the outside of the support 130. The sealing member 600 may include sealant and frit.

A filling material 610 is arranged between the first substrate 100 and the second substrate 200. The filling material 610 may perform a buffering function against external pressure, etc. The filling material 610 may include an organic material such as methyl silicon, phenyl silicon, or P1. However, the filling material 610 is not limited thereto and may include a urethane-based resin, an epoxy-based resin, an acrylic-based resin, which are organic sealants, or silicon, which is an inorganic sealant.

A polarization plate, a touchscreen panel, etc. may be further arranged on a top surface of the second substrate 200 which is opposite to a surface on which the second light-blocking pattern 210 is arranged.

Figure 6:
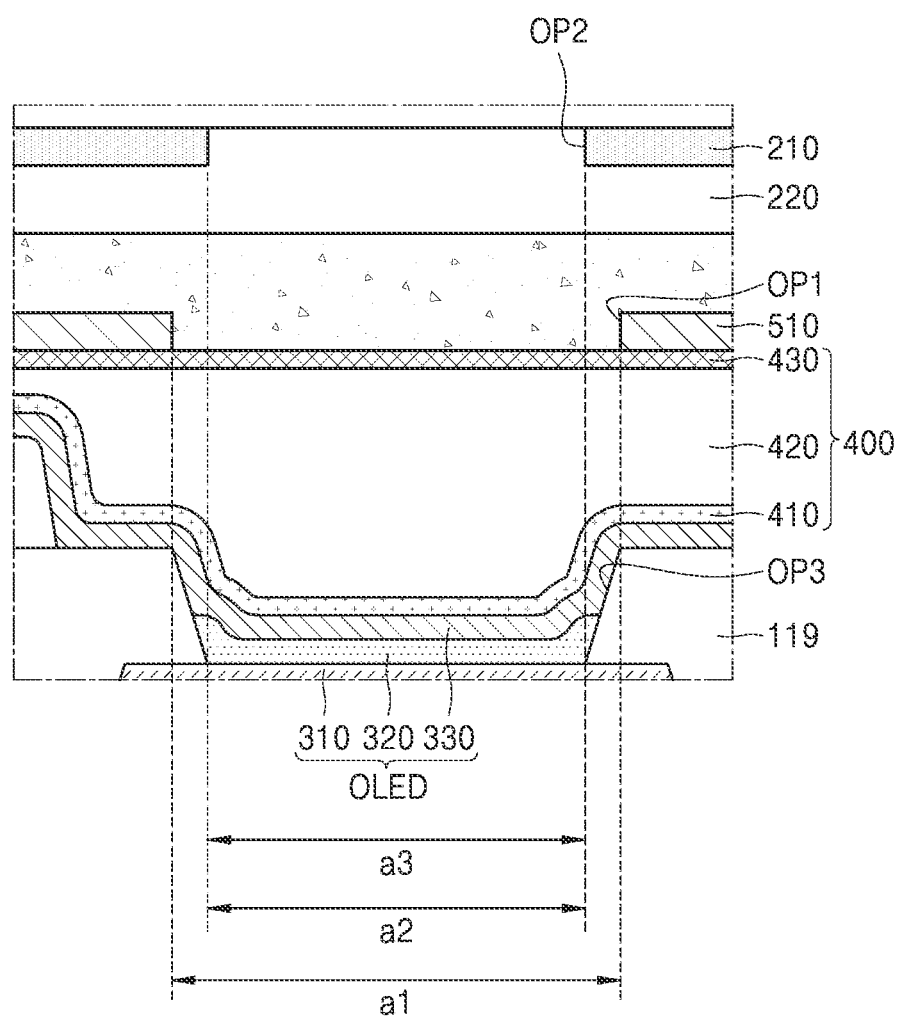
FIG. 6 is an enlarged cross-sectional view of a portion B of FIG. 4 according to an exemplary embodiment of the present invention.

FIG. 6 is an enlarged cross-sectional view of a portion B of FIG. 4 and shows arrangement relation of the pixel-defining layer 119, the pattern layer 500, and the second light-blocking pattern 210.

Referring to FIG. 6, the pixel-defining layer 119 includes the third opening OP3 that exposes a central portion of the pixel electrode 310. The emission area EA of the pixel P is defined by a lower end of the pixel-defining layer 119 where a lateral side of the third opening OP3 and the pixel electrode 310 meet each other. Since the lateral side of the third opening OP3 may have an oblique inclination, a bottom surface and a top surface of the third opening OP3 may have different areas. In the present embodiment, an area of the third opening OP3 may be defined as an area of the bottom surface which is a boundary where the lateral side of the third opening OP3 and the pixel electrode 310 meet each other.

The second opening OP2 is arranged in the second light-blocking pattern 210 on the second substrate 200 to correspond to the emission area EA. For example, the second opening OP2 is vertically aligned with the emission area EA such that the second opening OP2 overlaps the emission area EA. An area of the second opening OP2 may be substantially the same as an area of the third opening OP3. Since a final emission area EA through which light is emitted to the outside of the display device may be defined by the second opening OP2, it may be advantageous that the area of the second opening OP2 coincides with an emission area that emits light in the intermediate layer 320 in aspects of an aperture ratio and contrast. To express this, it is shown in FIG. 6 that a width a2 of the second opening OP2 and a width a3 of the third opening OP3 are the same.

The pattern layer 500 includes the first opening OP1 corresponding to the third opening OP3. For example, the first opening OP1 is vertically aligned with the third opening OP3 such that the first opening OP1 overlaps the third opening OP3. The area of the first opening OP1 may be greater than the area of the third opening OP3. That is, since the first light-blocking pattern 510 is arranged to correspond to a top surface of the pixel-defining layer 119, the area of the first opening OP1 may be greater than the area of the third opening OP3. The first light-blocking pattern 510 prevents light leakage and does not need to be equal to the emission area EA. In the case where the first light-blocking pattern 510 is designed to be equal to the emission area EA, when an error occurs due to a process variation, the emission area EA may be rather reduced. That is, to secure a process margin, the first opening OP1 may be greater than the third opening OP3 and the second opening OP2. To express this, it is shown in FIG. 6 that a width a1 of the first opening OP1 is greater than the width a2 of the second opening OP2 and the width a3 of the third opening OP3.

Figure 7:
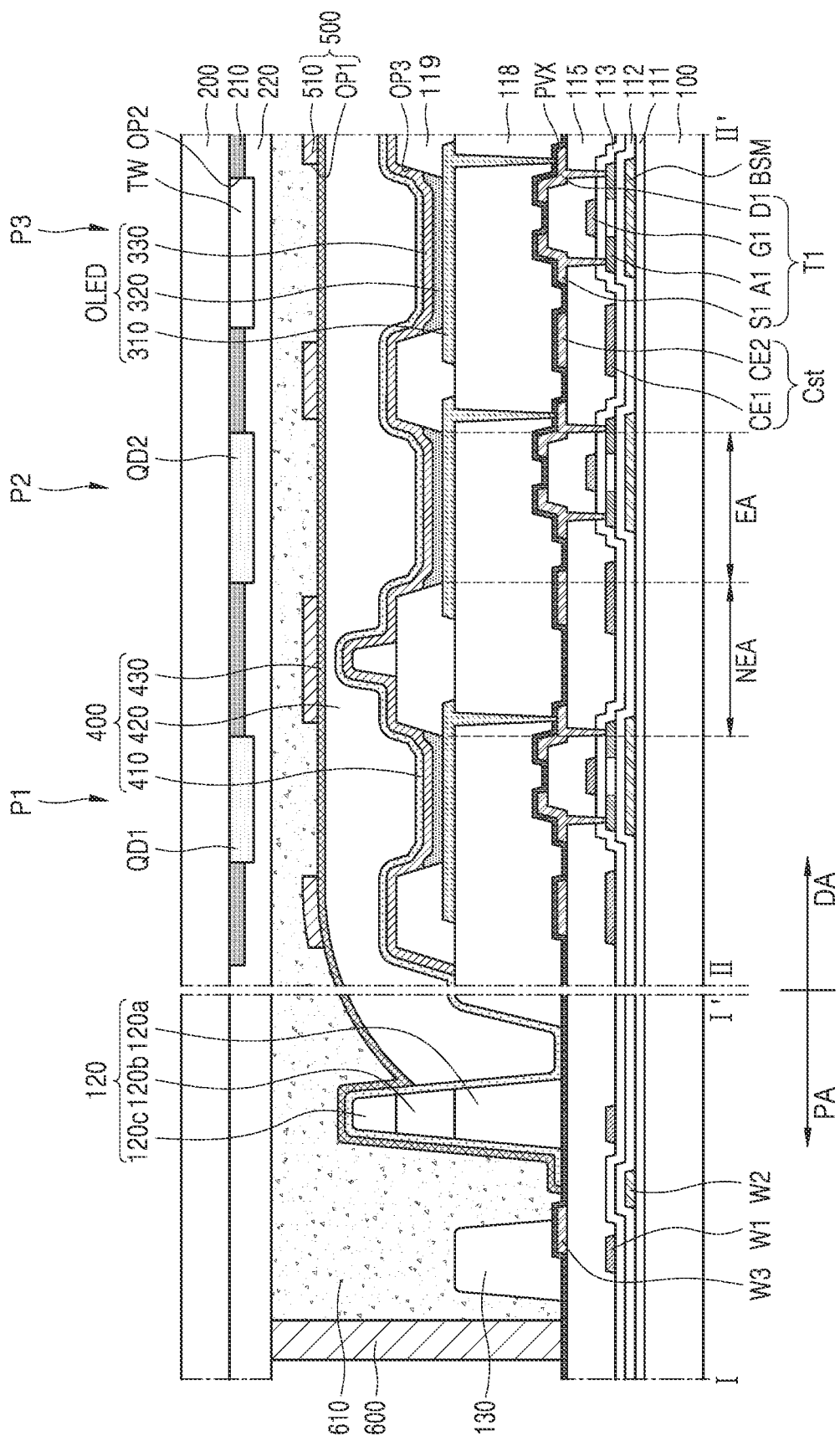
FIG. 7 is a cross-sectional view of an exemplary embodiment of the present invention.

FIG. 7 is a cross-sectional view of an exemplary embodiment. In FIG. 7, since the same reference numerals as those of FIG. 4 denote the same elements, repeated description thereof is omitted.

The display device according to an exemplary embodiment of the present invention includes the first pixel P1, the second pixel P2, and the third pixel P3 that are arranged in the display area DA, the thin-film encapsulation layer 400 covering the first pixel P1, the second pixel P2, and the third pixel P3, the pattern layer 500 arranged on the thin-film encapsulation layer 400, and the second substrate 200 on which the second light-blocking pattern 210 is formed.

In an exemplary embodiment, the second substrate 200 of the display device may include quantum emission layers QD1 and QD2, that is, a first quantum emission layer QD1 and a second quantum emission layer QD2, each including a quantum dot.

A quantum dot may include a semiconductor particle having a diameter ranging from about 2 nm to about 10 nm and include a particle having a peculiar electrical optical property. When a quantum dot is exposed to light, the quantum dot may emit light in a specific frequency depending on a size of the particle and a kind of a material. For example, when a quantum dot is exposed to light, the quantum dot may emit red, green, or blue light depending on a size of the particle and/or a kind of a material.

A core of a quantum dot may include a II-VI Group compound, a III-V Group compound, a IV-VI Group compound, a IV Group element, a IV Group compound, and a combination thereof.

The II-VI Group compound may include: a two-element compound including CdSe, CdTe, ZnS, ZnSe, ZnTe, ZnO, HgS, HgSe, HgTe, MgSe, MgS, or a mixture thereof; a three-element compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a four-element compound including HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof.

The III-V compound may include: a two-element compound including GaN, GaP, GaAs, GaSb, AlN, AlP, AlAs, AlSb, InN, InP, InAs, InSb, or a mixture thereof; a three-element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, or a mixture thereof; or a four-element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The IV-VI Group compound may include: a two-element compound including SnS, SnSe, SnTe, PbS, PbSe, PbTe, or a mixture thereof; a three-element compound including SnSeS, SnSeTe, SnSTe, PbSeS, PbSeTe, PbSTe, SnPbS, SnPbSe, SnPbTe, or a mixture thereof; or a four-element compound including SnPbSSe, SnPbSeTe, SnPbSTe, or a mixture thereof. The IV Group element may include Si, Ge, or a mixture thereof. The IV compound may include a two-element compound including SiC, SiGe, or a mixture thereof.

In this case, the two-element compound, the three-element compound, or the four-element compound may exist inside a particle with uniform concentration or exist inside the same particle with partially different concentration distribution. The compound may have a core/shell structure in which one quantum dot surrounds another quantum dot. An interface between the core and the shell may have concentration gradient in which concentration of an element existing in the shell reduces toward a center thereof.

In an exemplary embodiment, a quantum dot may have a core-shell structure including a core including a nano crystal, and a shell surrounding the core. The shell of the quantum dot may serve as a protective layer for maintaining a semiconductor characteristic by preventing chemical denaturalization of the core, and/or serve as a charging layer for giving an electrophoretic characteristic to the quantum dot. The shell may have a single layer or a multi-layer. An interface between the core and the shell may have concentration gradient in which concentration of an element existing in the shell reduces toward a center thereof. Examples of the quantum dot include an oxide of metal or nonmetal, a semiconductor compound, or a combination thereof.

For example, the oxide of metal or nonmetal may include a two-element compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a three-element compound including $MgAl_2O_4$, $CoFe_2O_4$, $NiFe_2O_4$, or $CoMn_2O_4$. The present invention, however, is not limited thereto.

The semiconductor compound may include CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb. The present invention, however, is not limited thereto.

The quantum dot may have a full width of half maximum (FWHM) of an emission wavelength spectrum of 45 nm or less, preferably 40 nm or less, more preferably 30 nm or less, and color saturation or color reproduction may be improved in this range. Since emitted light is discharged in all directions through the quantum dot, a light viewing angle may be improved.

The quantum dot has a shape generally used in a relevant field and is not particularly limited. More specifically, a spherical dot, a pyramid dot, a multi-arm dot, or a cubic nano particle, a nano tube, a nano wire, a nano fiber, a nano plate-shaped particle, etc. may be used.

The first quantum emission layer QD1 and the second quantum emission layer QD2 may be arranged to correspond to at least a portion of the emission area EA. For example, the first quantum emissions layer QD1 may correspond to the emission area EA of the first pixel P1, and the second quantum emission layer QD2 may correspond to the emission area EA of the second pixel P2. Instead of a quantum emission layer, a transmission window TW may be arranged in the emission area EA of the third pixel P3. The transmission window TW may include a material that may transmit light without wavelength conversion, the light being emitted from the organic light-emitting diode OLED of the third pixel P3. However, the transmission window is not limited thereto. A quantum emission layer may be arranged in the emission area EA of the third pixel P3.

In an exemplary embodiment, all of the plurality of organic light-emitting diodes OLED may emit blue light. In this case, the first quantum emission layer QD1 may include a quantum dot that emits red light, and the second quantum emission layer QD2 may include a quantum dot that emits green light. Therefore, light emitted to the outside of the display device may include red, green, and blue lights, and various color expressions may be made through a combination of these colors.

It may be understood that the first quantum emission layer QD1, the second quantum emission layer QD2, and the transmission window TW are arranged in the second opening OP2 of the second light-blocking pattern 210. Since the second light-blocking pattern 210 may include a black matrix that absorbs a visible light, color mixing of lights emitted from emission areas of neighbor pixels may be prevented, and visibility and contrast may be increased.

In an exemplary embodiment, since the pattern layer 500 includes the first light-blocking pattern 510 arranged on the thin-film encapsulation layer 400 and corresponding to the non-emission area NEA, the first light-blocking pattern 510 may block lights emitted from the emission areas of neighboring pixels that, if the first light-blocking pattern 510 does not exist, cannot be blocked by the second light-blocking pattern 210.

Figure 8:
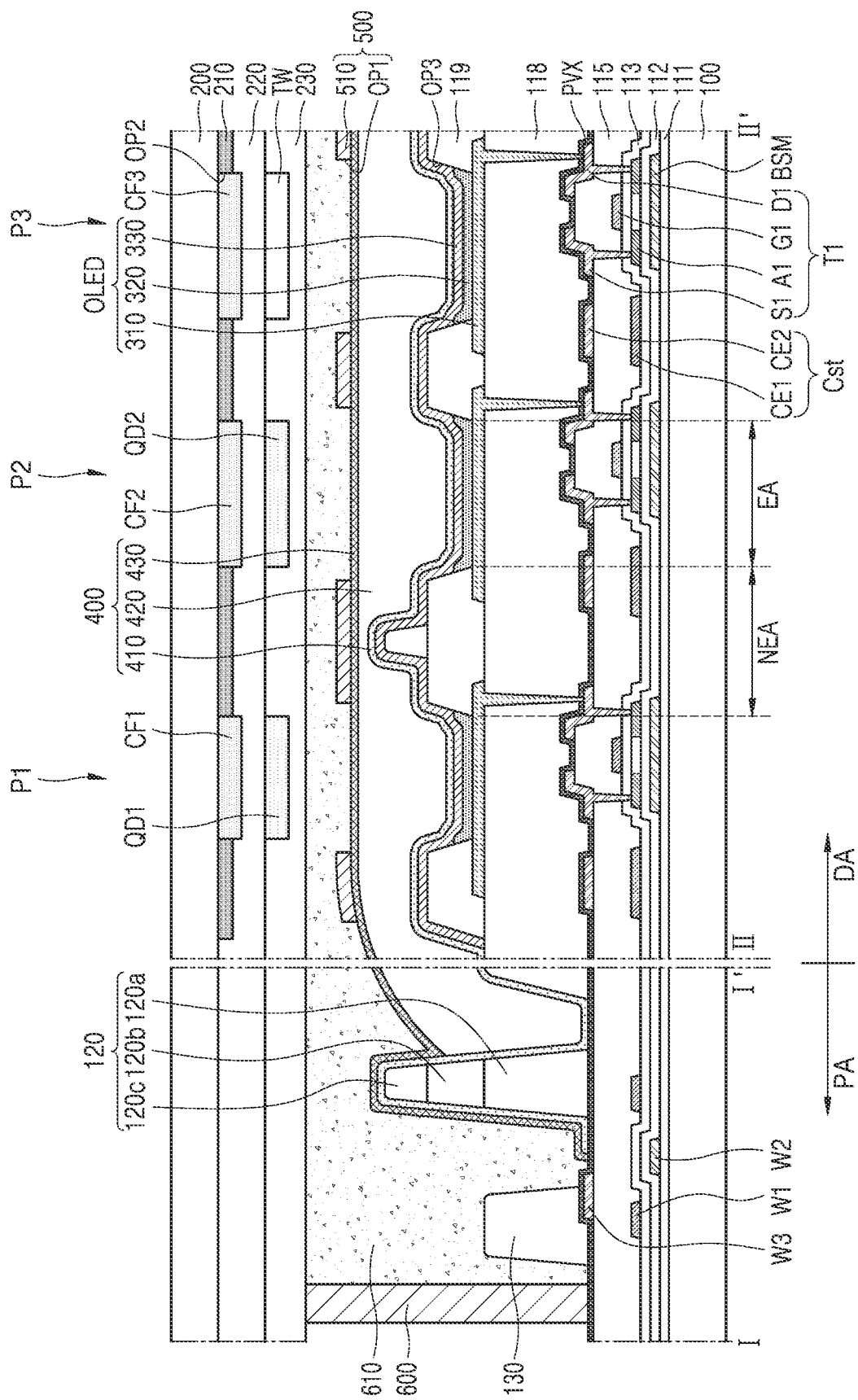
FIG. 8 is a cross-sectional view of an exemplary embodiment of the present invention.

FIG. 8 is a cross-sectional view of an exemplary embodiment. In FIG. 8, since the same reference numerals as those of FIG. 4 denote the same elements, repeated description thereof is omitted.

The display device according to an exemplary embodiment of the present invention includes the first pixel P1, the second pixel P2, and the third pixel P3 that are arranged in the display area DA, the thin-film encapsulation layer 400 covering the first pixel P1, the second pixel P2, and the third pixel P3, the pattern layer 500 arranged on the thin-film encapsulation layer 400, and the second substrate 200 including the second light-blocking pattern 210.

In an exemplary embodiment, the first quantum emission layer QD1 and the second quantum emission layer QD2 may be formed on the second substrate 200, each including a quantum dot, and color filters including a first color filter CF1, a second color filter CF2, and a third color filter CF3 may be formed on the second substrate 200. With the first color filter CF1, the second color filter CF2, and the third color filter CF3, a full-color image may be implemented and color saturation and outside visibility are increased.

The first color filter CF1, the second color filter CF2, and the third color filter CF3 may be arranged on the second substrate 200 to correspond to the second openings OP2 of the second light-blocking pattern 210. The protective layer 220 covers the second light-blocking pattern 210, and the first color filter CF1, the second color filter CF2, and the third color filter CF3.

Specifically, the first color filter CF1 may correspond to the emission area EA of the first pixel P1, the second color filter CF2 may correspond to the emission area EA of the second pixel P2, and the third color filter CF3 may correspond to the emission area EA of the third pixel P3.

The first quantum emission layer QD1, the second quantum emission layer QD2, and the transmission window TW overlap the first color filter CF1, the second color filter CF2, and the third color filter CF3 respectively with the protective layer 220 therebetween. An additional protective layer 230 is further arranged over the second substrate 200 to cover the first quantum emission layer QD1, the second quantum emission layer QD2, and the transmission window TW. The additional protective layer 230 may include an organic material or an inorganic material.

The first quantum emission layer QD1 and the second quantum emission layer QD2 may include quantum dots that emit different colors. For example, the first quantum emission layer QD1 may emit red light, and the second quantum emission layer QD2 may emit green light. The transmission window TW may transmit blue light emitted from the organic light-emitting diode OLED of the third pixel P3.

In this case, the first color filter CF1 may include a red color filter, the second color filter CF2 may include a green color filter, and the third color filter CF3 may include a blue color filter.

Since the display device according to the present embodiment increases a distance between the intermediate layer 320 of the organic light-emitting diode OLED and the second light-blocking pattern 210 due to the thin-film encapsulation layer 400 and/or the first quantum emission layer QD1 and the second quantum emission layer QD2, etc., color mixing of neighboring pixels may be prevented by introducing the first light-blocking pattern 510 therebetween.

Figure 9:
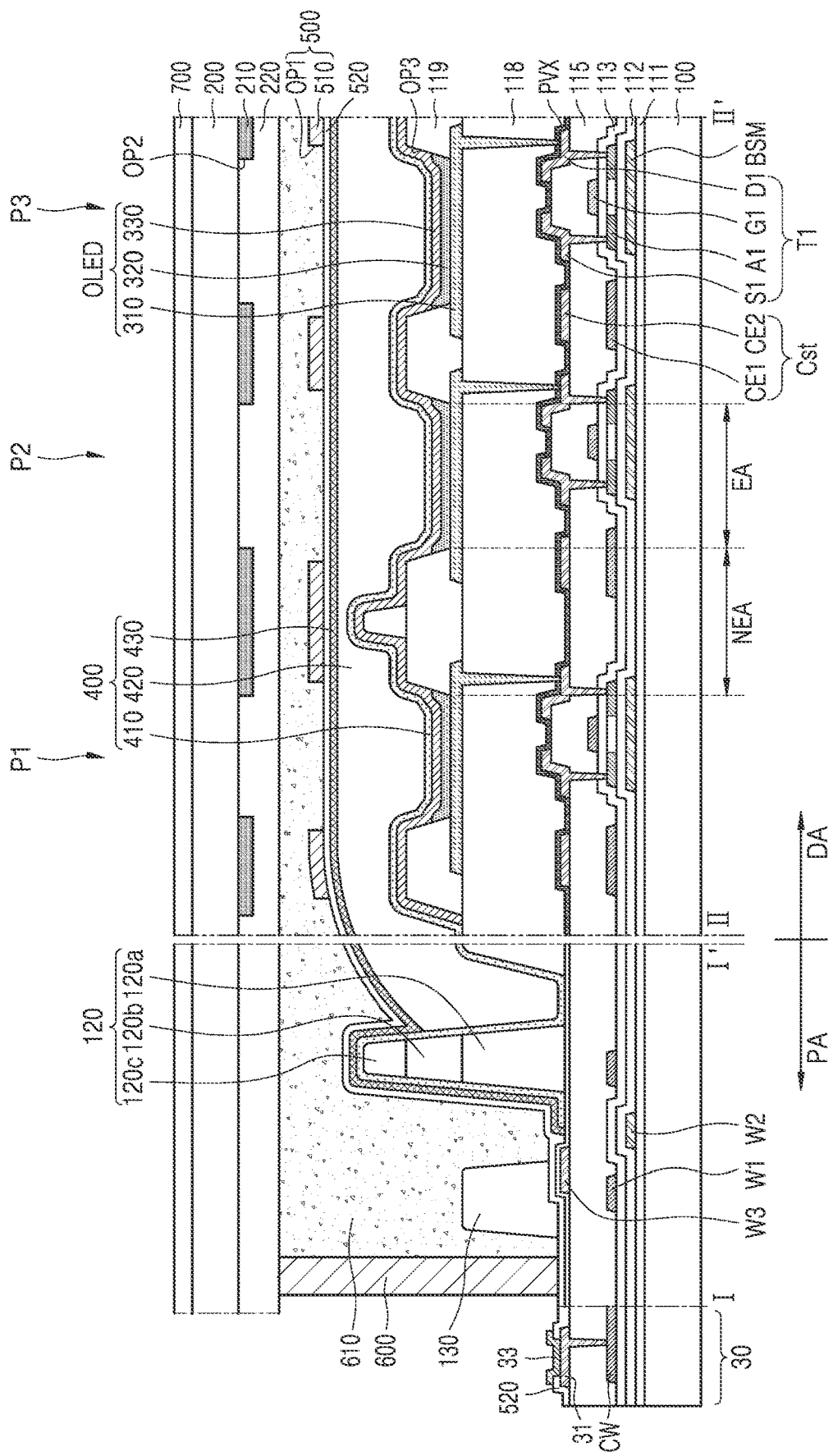
FIG. 9 is a cross-sectional view of an exemplary embodiment of the present invention.

FIG. 9 is a cross-sectional view of an exemplary embodiment. In FIG. 9, since the same reference numerals as those of FIG. 4 denote the same elements, repeated description thereof is omitted.

The display device according to an exemplary embodiment of the present invention includes the first pixel P1, the second pixel P2, and the third pixel P3 that are arranged in the display area DA, the thin-film encapsulation layer 400 covering the first pixel P1, the second pixel P2, and the third pixel P3, the pattern layer 500 arranged on the thin-film encapsulation layer 400, and the second substrate 200 including the second light-blocking pattern 210.

A third buffer layer 520 is further arranged between the pattern layer 500 and the thin-film encapsulation layer 400. The third buffer layer 520 may be introduced to efficiently form the first light-blocking pattern 510 of the pattern layer 500.

The third buffer layer 520 is formed on the thin-film encapsulation layer 400 over the entire surface of the first substrate 100. In the case where the first light-blocking pattern 510 includes metal, a metal layer constituting the first light-blocking pattern 510 is entirely formed on the third buffer layer 520, and then the metal layer may be patterned through etching. In this case, the third buffer layer 520 may serve to prevent the metal layer from being lifted in the process of forming the metal layer.

The third buffer layer 520 may include $SiO_2$, $SiN_x$, SiON, $Al_2O_3$, $TiO_2$, $Ta_2O_5$, $HfO_2$, or $ZnO_2$.

The third buffer layer 520 extends to not only the display area DA but also the peripheral area PA. In this case, a contact hole may be formed in the third buffer layer 520 to expose a terminal 31 of the terminal unit 30. An additional terminal layer 33 is arranged inside the contact hole, the additional terminal layer 33 being simultaneously formed with the first light-blocking pattern 510 by using the same material as that of the first light-blocking pattern 510.

The terminal 31 is connected to a connection wiring CW through a contact hole, the connection wiring CW being arranged on a different layer and transferring an electrical signal to the display area DA. The connection wiring CW may be formed on the same layer as a layer on which the gate electrode G1 is arranged and may include the same material as that of the gate electrode G1. The terminal 31 may be arranged on the same layer as a layer on which the source electrode/drain electrode S1/D1 are arranged and may include the same material as that of the source electrode/drain electrode S1/D1.

A touchscreen panel 700 is further arranged on a surface of the second substrate 200 that is opposite to a surface of the second substrate 200 on which the second light-blocking pattern 210 is arranged. The touchscreen panel 700 may include a touch electrode and measure a position coordinate of a contact portion on a surface of the touchscreen panel 700. A window may be further arranged on the touchscreen panel 700.

Figure 10:
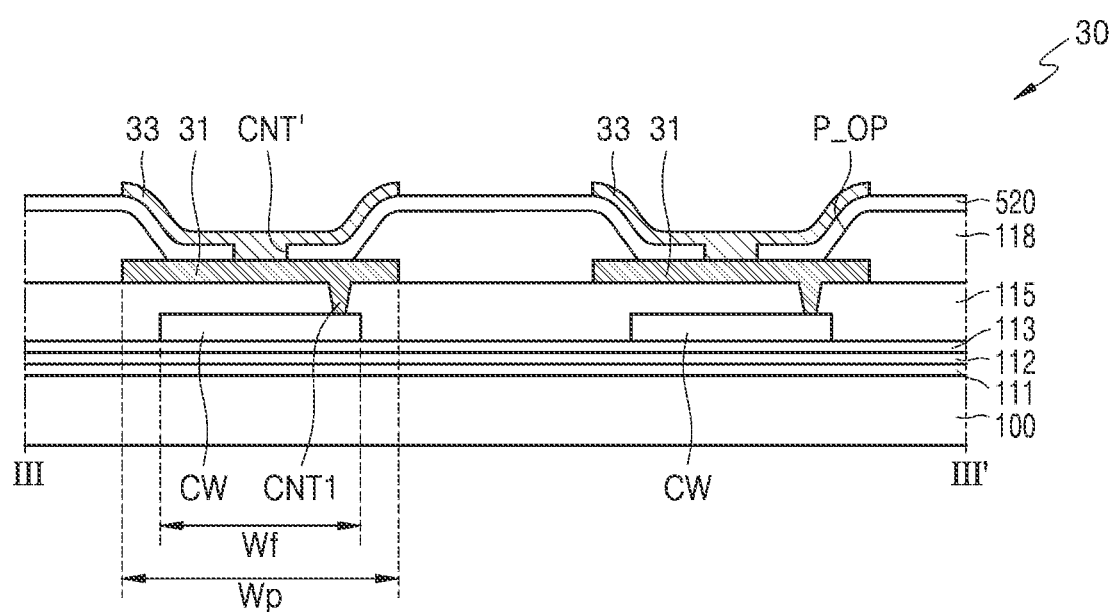
FIG. 10 is a cross-section taken along line III-III' of FIG. 1 according to an exemplary embodiment of the present invention.

FIG. 10 is a cross-sectional view of an exemplary embodiment. In FIG. 10, since the same reference numerals as those of FIG. 9 denote the same elements, repeated description thereof is omitted. FIG. 10 is a cross-section taken along line III-III' and shows a portion of the terminal unit 30.

The terminal unit 30 of the display device according to an exemplary embodiment of the present invention includes the terminal 31 and the additional terminal layer 33, the terminal 31 being connected to the connection wiring CW through a first contact hole CNT1, and the additional terminal layer 33 being connected to the terminal 31 through a second contact hole CNT'.

The connection wiring CW is arranged on the gate insulating layer 113. The connection wiring CW is arranged on the same layer as a layer on which the gate electrode G1 (see FIG. 9) is arranged and may include the same material as that of the gate electrode G1. The terminal 31 is arranged on the interlayer insulating layer 115. The terminal 31 is arranged on the same layer as a layer on which the source electrode S1 (see FIG. 9) is arranged and may include the same material as that of the source electrode S1. The additional terminal layer 33 is arranged on the third buffer layer 520 and may include the same material as that of the first light-blocking pattern 510 (see FIG. 9).

The first contact hole CNT1 passes through the interlayer insulating layer 115 to expose a portion of the connection wiring CW arranged thereunder. The second contact hole CNT' passes through the third buffer layer 520 to expose a portion of the terminal 31 arranged thereunder.

The additional terminal layer 33 is connected to the terminal 31 through the second contact hole CNT', and the terminal 31 is connected to the connection wiring CW through the first contact hole CNT1. A width Wf of the connection wiring CW in one direction may be less than a width Wp of the terminal 31 in one direction.

Edges of the terminal 31 are covered by the planarization layer 118. The planarization layer 118 includes an opening P_OP exposing a central portion of the terminal 31.

The third buffer layer 520 is arranged on the planarization layer 118 and covers the terminal 31. The second contact hole CNT' of the third buffer layer 520 is disposed in the opening P_OP.

The additional terminal layer 33 may be simultaneously formed while the first light-blocking pattern 510 including a metal layer is formed. As described above, since the terminal unit 30 further includes the additional terminal layer 33 over the terminal 31, the additional terminal layer 33 being connected to the terminal 31, an electrical resistance of the terminal unit 30 may be reduced.

Up to now, embodiments applicable to the present disclosure have been described. The embodiments may be implemented as separate embodiments and implemented as a combined embodiment.

As described above, since the display device according to embodiments includes the pattern layer 500, a high-quality image may be displayed.

These and/or other aspects will become apparent and more readily appreciated from the following description of the embodiments, taken in conjunction with the accompanying drawings.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a first substrate including a display area and a peripheral area outside the display area;
    a plurality of organic light-emitting diodes in the display area, each of the plurality of organic light-emitting diodes including a pixel electrode, an intermediate layer, and an opposite electrode;
    a thin-film encapsulation layer covering the plurality of organic light- emitting diodes and including a first inorganic encapsulation layer, an organic encapsulation layer, and a second inorganic encapsulation layer that are sequentially stacked;
    a buffer layer arranged on the thin-film encapsulation layer and covering the display area and the peripheral area;
    a pattern layer on the buffer layer, the pattern layer including a first light- blocking pattern shielding a portion of an area between two adjacent organic light-emitting diodes of the plurality of organic light-emitting diodes and
    a terminal arranged in the peripheral area and a connection wiring arranged below the terminal, wherein the buffer layer directly contacts a portion of the terminal, and the buffer layer includes
    a first contact hole that exposes the terminal and a width of the terminal is greater than a width of the connection wiring.

2. The display device of claim 1, further comprising:
    an additional terminal layer contacting the terminal through the first contact hole,
    wherein the additional terminal layer includes a same material as that of the first light-blocking pattern.

3. The display device of claim 1, further comprising: the connection wiring extending from the peripheral area to the display area, wherein the connection wiring is connected to the terminal through a second contact hole.

4. The display device of claim 1, further comprising:
    a second substrate facing the first substrate and including a second light-blocking pattern that is vertically aligned to the first light-blocking pattern.

5. The display device of claim 4, wherein the pattern layer further includes a first opening that is vertically aligned to a corresponding emission area of a plurality of emission areas, the second light-blocking pattern includes a second opening that is vertically aligned to the corresponding emission area of the plurality of emission areas, and an area of the first opening is greater than an area of the second opening.

6. The display device of claim 4, further comprising: a plurality of quantum emission layers disposed on the second substrate, each of the plurality of quantum emission layers being vertically aligned to a corresponding emission area of a plurality of emission areas and including a quantum dot.

7. The display device of claim 4, further comprising:
    a sealing member arranged in the peripheral area, wherein the first substrate and the second substrate are attached to each other by the sealing member.

8. The display device of claim 1, wherein the first light-blocking pattern includes metal.

9. The display device of claim 1, wherein the plurality of organic light-emitting diodes emit blue light.

\* \* \* \* \*